US012690159B2

(12) United States Patent (10) Patent No.: US 12,690,159 B2
Tsuchida et al. (45) Date of Patent: Jul. 21, 2026

(54) ELECTRONIC APPARATUS AND CONTROL METHOD THEREFOR

(71) Applicant: Sony Interactive Entertainment Inc., Tokyo (JP)

(72) Inventors: Shinya Tsuchida, Tokyo (JP); Nils Sabelstrom, Uppsala (SE); Mitsuharu Morishita, Tokyo (JP); Masanori Hayashibara, Tokyo (JP); Yasuhiro Ootori, Kanagawa (JP); Keiichi Aoki, Tokyo (JP)

(73) Assignee: SONY INTERACTIVE ENTERTAINMENT INC., Tokyo (JP)

( * ) Notice: Subject to any disclaimer, the term of this patent is extended or adjusted under 35 U.S.C. 154(b) by 541 days.

(21) Appl. No.: 18/249,573

(22) PCT Filed: Nov. 1, 2021

(86) PCT No.: PCT/JP2021/040233
§ 371 (c)(1),
(2) Date: Apr. 19, 2023

(87) PCT Pub. No.: WO2022/092311
PCT Pub. Date: May 5, 2022

(65) Prior Publication Data
US 2023/0345665 A1 Oct. 26, 2023

(30) Foreign Application Priority Data
Nov. 2, 2020 (JP) ................................. 2020-183657

(51) Int. Cl.
*H05K 7/20* (2006.01)
*G06F 1/20* (2006.01)

(52) U.S. Cl.
CPC ......... *H05K 7/20209* (2013.01); *G06F 1/206* (2013.01); *H05K 7/20136* (2013.01)

(58) Field of Classification Search
CPC . G06F 1/206; H05K 7/20209; H05K 7/20136
See application file for complete search history.

(56) References Cited

U.S. PATENT DOCUMENTS 5,484,012 A 1/1996 Hiratsuka
2009/0092261 A1* 4/2009 Bard ..................... G06F 1/3203
381/71.1
(Continued)

FOREIGN PATENT DOCUMENTS

CN 109563844 A 4/2019
CN 109595713 A 4/2019
(Continued)

OTHER PUBLICATIONS

Notice of Reasons for Refusal for corresponding JP Application No., 2022-559449, 15 pages, dated Jun. 11, 2024.
(Continued)

*Primary Examiner* — Mark A Connolly
(74) *Attorney, Agent, or Firm* — Kilpatrick Townsend & Stockton LLP

(57) ABSTRACT

Provided is an electronic apparatus that acquires an ambient temperature of the electronic apparatus and operates a cooling device to cool a component that generates heat during an operation. When the ambient temperature is lower than a predetermined reference temperature, the electronic apparatus exercises control to increase an output of the cooling device to a value higher than that obtained when the ambient temperature is equal to or higher than the reference temperature.

7 Claims, 4 Drawing Sheets

(56)     References Cited

U.S. PATENT DOCUMENTS

| | | | |
|---|---|---|---|
| 2010/0030500 A1* | 2/2010 | Refai-Ahmed | G06F 1/3203 |
| | | | 702/64 |
| 2010/0228403 A1* | 9/2010 | Eto | G05D 23/1931 |
| | | | 700/300 |
| 2014/0118925 A1* | 5/2014 | Huang | G06F 1/206 |
| | | | 361/679.48 |
| 2015/0156445 A1* | 6/2015 | Lee | G06F 1/3296 |
| | | | 348/730 |
| 2015/0198957 A1* | 7/2015 | Montero | G06F 3/0481 |
| | | | 700/300 |
| 2017/0138628 A1* | 5/2017 | Sondur | F24F 11/63 |
| 2023/0289233 A1* | 9/2023 | Bassett | G06F 9/5044 |

FOREIGN PATENT DOCUMENTS

| | | |
|---|---|---|
| JP | 04021675 A | 4/1992 |
| JP | 0584199 U | 11/1993 |
| JP | 07253485 A | 10/1995 |
| JP | 2003076444 A | 3/2003 |

OTHER PUBLICATIONS

International Search Report for corresponding PCT Application No. PCT/JP2021/040233, 4 pages, dated Feb. 1, 2022.

* cited by examiner

F I G . 1
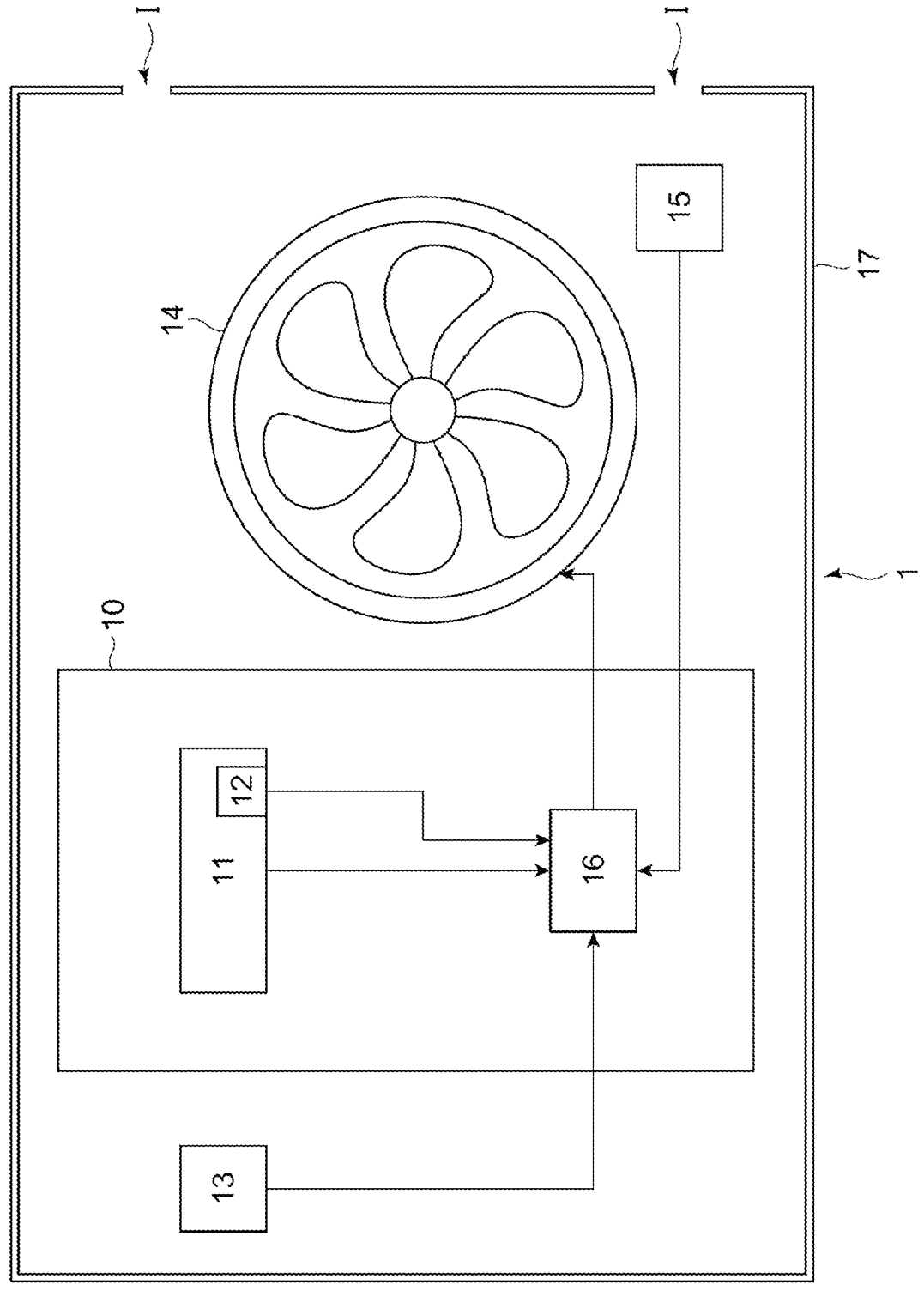

(a)

SECOND COMPONENT TEMPERATURE (b)

F I G . 4

| CONTROL MODE | TYPE OF PROGRAM | TARGET TEMPERATURE FOR FIRST COMPONENT 11 | ROTATION SPEED OFFSET VALUE FOR COOLING FAN 14 | RESPONSE PERFORMANCE |
|---|---|---|---|---|
| CONTROL MODE 1 | GAME APPLICATION | T1a | Va | HIGH |
| CONTROL MODE 2 | VIDEO REPRODUCTION APPLICATION INVOLVING MEDIA READING | T1b | Vb | LOW |
| CONTROL MODE 3 | VIDEO REPRODUCTION APPLICATION INVOLVING NO MEDIA READING | T1c | Vc | LOW |

ELECTRONIC APPARATUS AND CONTROL METHOD THEREFOR

TECHNICAL FIELD

The present invention relates to an electronic apparatus that controls a cooling device, and to a control method for the electronic apparatus.

BACKGROUND ART

In general, components included in an electronic apparatus, such as processors, generate heat during their operation. Leaving the generated heat uncontrolled may cause malfunction or deterioration. Therefore, the components generating heat need to be cooled by using a cooling fan or other cooling device.

[Summary] [Technical Problem]

In the electronic apparatus described above, allowing the cooling device to continue operating at a constantly high output is not preferable because, for example, noise generation and unnecessary power consumption may occur. Therefore, in some cases, control is exercised to monitor the temperature of a component requiring cooling, and increase the output of the cooling device when the temperature increases. However, required cooling may not always be provided simply by exercising such control.

The present invention has been made in view of the above circumstances. An object of the present invention is to provide an electronic apparatus capable of providing effective cooling under specific conditions and a control method for the electronic apparatus.

Solution to Problem

According to an aspect of the present invention, there is provided an electronic apparatus having a component that generates heat during an operation. The electronic apparatus includes a temperature acquisition section and a cooling control section. The temperature acquisition section acquires an ambient temperature of the electronic apparatus. The cooling control section operates a cooling device to cool the component that generates heat during the operation. When the ambient temperature is lower than a predetermined reference temperature, the cooling control section exercises control to increase an output of the cooling device to a value higher than that obtained when the ambient temperature is equal to or higher than the reference temperature.

According to another aspect of the present invention, there is provided an electronic apparatus having a component that generates heat during an operation. The electronic apparatus includes an operation information acquisition section and a cooling control section. The operation information acquisition section acquires information regarding an operating status of the electronic apparatus. The cooling control section operates a cooling device to cool the component that generates heat during the operation. Based on the information regarding the operating status, the cooling control section changes a control scheme for operating the cooling device.

According to yet another aspect of the present invention, there is provided a control method for an electronic apparatus having a component that generates heat during an operation. The control method includes a step of acquiring an ambient temperature of the electronic apparatus, and a cooling step of operating a cooling device to cool the component that generates heat during the operation. When the ambient temperature is lower than a predetermined reference temperature, the cooling step exercises control to increase an output of the cooling device to a value higher than that obtained when the ambient temperature is equal to or higher than the reference temperature.

BRIEF DESCRIPTION OF DRAWINGS

FIG. 1 is a schematic configuration diagram illustrating an outline configuration of an electronic apparatus according to an embodiment of the present invention.

FIG. 4 is a diagram illustrating examples of control modes used for cooling control.

DESCRIPTION OF EMBODIMENT

Figure 2:
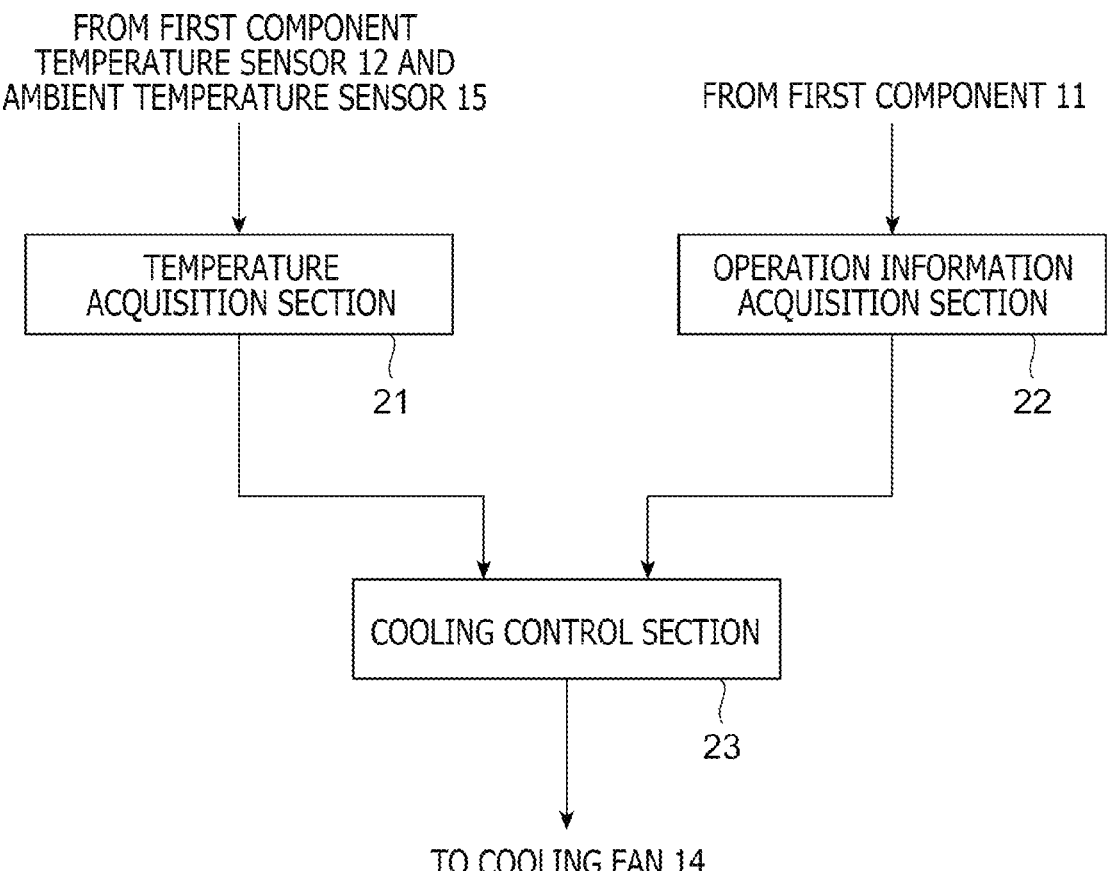
FIG. 2 is a functional block diagram illustrating functions implemented by the electronic apparatus according to the embodiment of the present invention.

An embodiment of the present invention will now be described with reference to the accompanying drawings.

FIG. 1 is a schematic configuration diagram illustrating an outline configuration of an electronic apparatus 1 according to the embodiment of the present invention. The electronic apparatus 1, which is, for example, a home video game machine or a personal computer, includes a printed circuit board 10, a first component 11, a first component temperature sensor 12, a second component 13, a cooling fan 14, an ambient temperature sensor 15, a control circuit 16, and a case 17.

The printed circuit board 10 is a circuit board on which various circuit components for implementing functions of the electronic apparatus 1 are mounted and is fastened to the inside of the case 17. In the present embodiment, the later-described first component 11 and control circuit 16 are mounted on the printed circuit board 10. Although not depicted in FIG. 1, the electronic apparatus 1 may include various circuit boards other than the printed circuit board 10.

The first component 11 generates heat during an operation of the electronic apparatus 1 and needs to be cooled by the cooling fan 14. It is assumed that the first component 11 generates a significant amount of heat as compared with the other components disposed in the electronic apparatus 1 and is in high need for cooling. More specifically, it is assumed that the first component 11 in the present embodiment is a microprocessor for implementing main functions of the electronic apparatus 1 and is configured to perform various information processing tasks by executing various application programs stored in a solid state drive (SSD) or other storage section (not depicted in the drawings).

The first component temperature sensor 12 is a sensor for measuring the temperature of the first component 11. The first component temperature sensor 12 may be a sensor built in the first component 11 or a separate sensor disposed adjacent to the first component 11. The temperature measured by the first component temperature sensor 12 is hereinafter referred to as the first component temperature. The first component temperature reflects temperature changes due to heat generation and cooling of the first component 11 itself.

The second component 13 generates heat during the operation and needs to be cooled by the cooling fan 14, as is the case with the first component 11. It is assumed that the second component 13 is in low need for cooling as compared to the first component 11. The temperature of the second component 13 is hereinafter referred to as the second component temperature. In the present embodiment, however, it is assumed that no sensor is included to directly measure the second component temperature due, for instance, to apparatus configuration limitations. Further, it is assumed that the second component 13 is positioned at a certain distance from the first component 11, and that the first component temperature measured by the first component temperature sensor 12 remains unaffected by changes in the temperature of the second component 13. That is, the first component temperature and the second component temperature change independently based on states of respective related circuit components.

As a specific example, the second component 13 may be a component included in a power supply unit. Such a component is not mounted on the printed circuit board 10 but is disposed away from the printed circuit board 10. Therefore, the changes in the second component temperature are different from the changes in the first component temperature. Further, it is difficult in some cases to dispose, for example, an additional circuit board and install a temperature sensor for measuring the temperature in the power supply unit.

The cooling fan 14 is a cooling device used for cooling various components in the case 17 and is configured to operate based on a control signal received from the control circuit 16. More specifically, the cooling fan 14 cools the interior of the case 17 by taking in outside air from air inlets I provided in the case 17 and blowing the outside air into the case 17. In the present embodiment, in particular, the cooling fan 14 simultaneously cools both the first component 11 and the second component 13 to decrease their temperatures.

The ambient temperature sensor 15 is a sensor for measuring the temperature of an environment surrounding the electronic apparatus 1. It is assumed in the present embodiment that the ambient temperature sensor 15 is disposed near an air inlet I provided in the case 17 (i.e., disposed at a position between the air inlet I and the cooling fan 14) in order to measure the temperature of the air taken in by the cooling fan 14. The temperature measured by the ambient temperature sensor 15 is hereinafter referred to as the ambient temperature. The ambient temperature reflects the temperature of the external environment surrounding the electronic apparatus 1. Basically, changes in the ambient temperature are not directly linked to the first component temperature and the second component temperature. However, the absolute value of the ambient temperature affects the first component temperature and the second component temperature as well. That is, in a case where cooling is not provided by the cooling fan 14, the first component temperature and the second component temperature increase accordingly with an increase in the ambient temperature. This increases the need for cooling.

The control circuit 16 is an integrated circuit for controlling an operation of the cooling fan 14 and is connected to each of the first component 11, the first component temperature sensor 12, the ambient temperature sensor 15, and the cooling fan 14 through a control signal line. As depicted in FIG. 2, the control circuit 16 functionally includes a temperature acquisition section 21, an operation information acquisition section 22, and a cooling control section 23. The functions of these sections included in the control circuit 16 are implemented when the control circuit 16 operates according to a built-in program.

The temperature acquisition section 21 acquires, continuously at predetermined time intervals, results of respective temperature measurements made by the first component temperature sensor 12 and the ambient temperature sensor 15. Information regarding the temperatures acquired by the temperature acquisition section 21 is supplied to the cooling control section 23.

The operation information acquisition section 22 acquires information regarding an operating status of the electronic apparatus 1. More specifically, the operation information acquisition section 22 acquires information regarding a currently executed application program from the first component 11 (hereinafter referred to as the program execution information). In a case where the execution of a new program is to be started or the currently executed program is to be changed according, for example, to user instructions, the first component 11 transmits, to the control circuit 16, the program execution information regarding the program to be newly executed. The operation information acquisition section 22 acquires the transmitted program execution information and supplies the acquired program execution information to the cooling control section 23.

The cooling control section 23 controls the operation of the cooling fan 14 according to information regarding the first component temperature and ambient temperature acquired by the temperature acquisition section 21. Alternatively, the cooling control section 23 in the present embodiment may control the operation of the cooling fan 14 according to the program execution information acquired by the operation information acquisition section 22. Specific examples of such control will be described later.

It is assumed in the present embodiment that the cooling control section 23 operates the cooling fan 14 by outputting a drive signal of pulse-width modulation type to the cooling fan 14. The cooling control section 23 changes a rotation speed of the cooling fan 14 by changing a duty ratio of the drive signal to be outputted to the cooling fan 14. This enables the control circuit 16 to control the output (cooling performance) of the cooling fan 14. It is assumed that an offset value (minimum output value) is set for the rotation speed of the cooling fan 14, and that the cooling fan 14 constantly operates at a rotation speed equivalent to or higher than the minimum output value during the operation of the electronic apparatus 1.

The following describes specific examples of cooling control that is provided by the cooling control section 23 according to the results of respective temperature measurements made by the first component temperature sensor 12 and the ambient temperature sensor 15. In the following description, it is assumed that target temperatures for the first component 11 and the second component 13 are referred to as the target temperatures T1 and T2, respectively. That is, the cooling control section 23 should preferably provide cooling control during the operation of the electronic apparatus 1 in such a manner that the first component temperature is not higher than the target temperature T1, and that the second component temperature is not higher than the target temperature T2. It is assumed that information regarding the target temperature T1 is pre-stored in the control circuit 16. Meanwhile, information regarding the target temperature T2 need not be stored in the control circuit 16 because, as mentioned earlier, the electronic apparatus 1 does not directly measure the second component temperature.

First, in order to cool the first component 11, the cooling control section 23 exercises control to change the output of the cooling fan 14 according to the first component temperature measured by the first component temperature sensor 12. Particularly, the cooling control section 23 exercises control to increase the output of the cooling fan 14 in a case where the first component temperature becomes high, and decrease the output of the cooling fan 14 in a case where the first component temperature becomes low.

More specifically, the cooling control section 23 compares the first component temperature acquired by the temperature acquisition section 21 with the target temperature T1 stored in the cooling control section 23, and when the first component temperature is higher than the target temperature T1, increases the duty ratio of the drive signal to increase the rotation speed of the cooling fan 14. This increases the cooling performance of the cooling fan 14 and thus decreases the temperature of the first component 11. Further, the cooling control section 23 continuously increases the output of the cooling fan 14 when the first component temperature becomes increasingly higher than the target temperature T1. Therefore, when the temperature of the first component 11 becomes high, the cooling control section 23 is able to cool the first component 11 more rapidly and decrease its temperature to a value not higher than the target temperature T1. Meanwhile, when the first component temperature is equal to or lower than the target temperature T1, the cooling control section 23 decreases the rotation speed of the cooling fan 14 to the offset value. Since the above-described control is adopted, the cooling control section 23 is able to provide control in such a manner that the temperature of the first component 11 remains equal to or lower than the target temperature T1.

Further, independently of the above-described cooling control based on the first component temperature, the cooling control section 23 controls the operation of the cooling fan 14 according to the ambient temperature measured by the ambient temperature sensor 15. In the present embodiment, in particular, the cooling control section 23 exercises control to increase the output of the cooling fan 14 when the ambient temperature is lower than a predetermined reference temperature Tr. It is assumed that information regarding the reference temperature Tr is pre-stored in the control circuit 16. In general, when the temperature becomes high, cooling by the cooling fan 14 is needed. Meanwhile, when the temperature becomes low, the need for such cooling decreases. However, in the present embodiment, the temperature of the second component 13 (second component temperature) in need of cooling is not directly monitored, whereas cooling control is provided based on the first component temperature as mentioned earlier. Therefore, when the ambient temperature is low, the output generated by cooling control based on the first component temperature may decrease, resulting in a state where the second component 13 is not sufficiently cooled.

Figure 3:
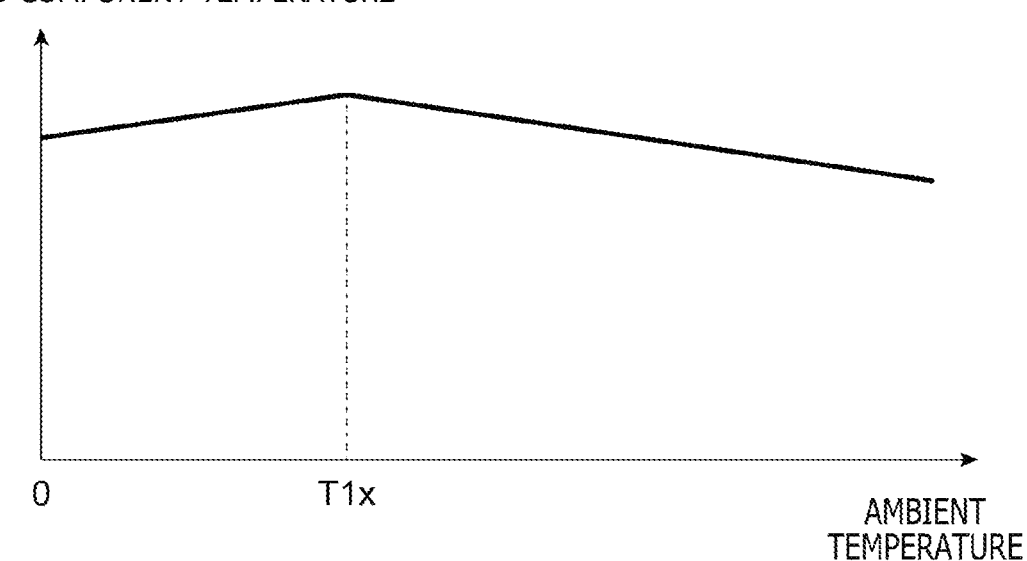
FIG. 3 is a set of graphs illustrating cooling control that is provided by the electronic apparatus according to the embodiment of the present invention.
Figure 3:
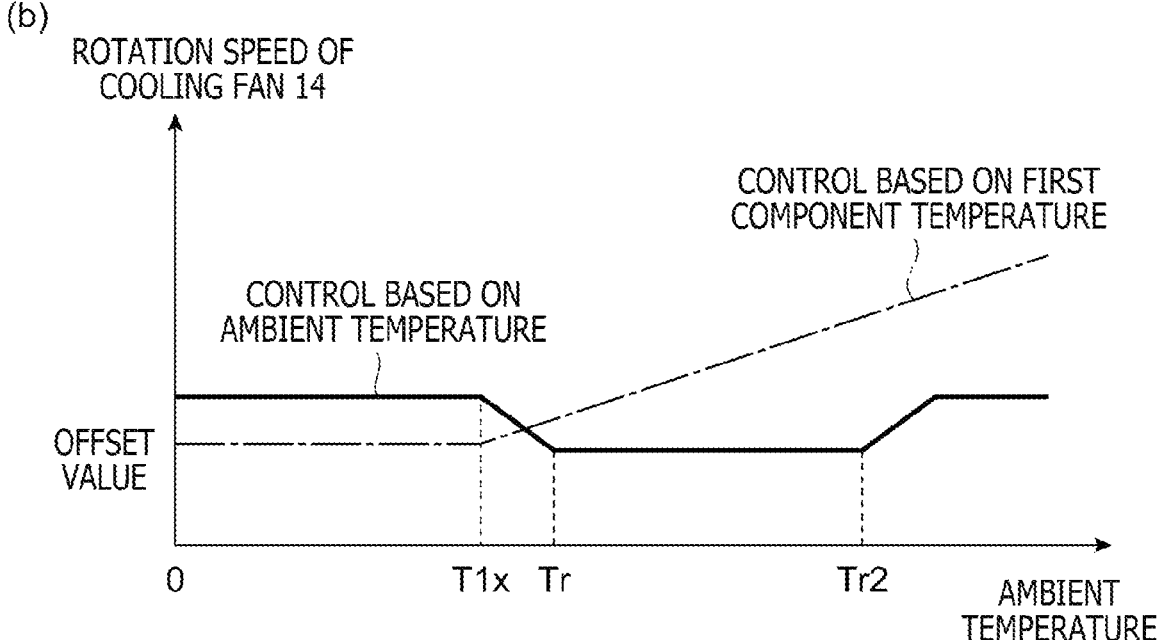

FIG. 3 is a set of diagrams illustrating an outline of cooling control that is provided based on the ambient temperature by the electronic apparatus 1. The graph in (a) of FIG. 3 depicts a relation between the ambient temperature and the second component temperature under predetermined operating conditions. More specifically, this graph gives an overview of changes in the second component temperature that are actually measured in a case where the electronic apparatus 1 is operated at a high output (in a high-load state) (when the electronic apparatus 1 is operated in a state where significant heat is presumably generated by the first component 11) and the above-described cooling control is exercised based on the first component temperature without exercising cooling control based on the ambient temperature. Further, the graph in (b) of FIG. 3 depicts cooling control provided by the cooling control section 23. More specifically, a horizontal axis indicates the ambient temperature corresponding to the ambient temperature depicted in (a) of FIG. 3, and a vertical axis indicates control instructions (instruction regarding the rotation speed of the cooling fan 14) that are issued from the cooling control section 23 to the cooling fan 14. In the graph depicted in (b) of FIG. 3, a one-dot chain line indicates control exercised based on the first component temperature, whereas a solid line indicates control exercised based on the ambient temperature.

In the example of FIG. 3, when the electronic apparatus 1 continuously operates at a high output in a state where the ambient temperature is higher than T1x, the first component temperature increases to a value higher than the target temperature T1. The ambient temperature T1x represents a lower-limit value of the ambient temperature at which the temperature of the first component 11 increases up to the target temperature T1 under conditions where the electronic apparatus 1 operates at a high output. That is, when the ambient temperature is lower than T1x, it is presumable that the first component temperature remains below the target temperature T1. Conversely, when the ambient temperature becomes higher than T1x, the first component temperature easily becomes higher accordingly. In this state, the cooling control section 23 exercises control to increase the rotation speed of the cooling fan 14 in response to an increase in the first component temperature above the target temperature T1 as mentioned earlier. Consequently, when the ambient temperature is equal to or higher than T1x, the cooling fan 14 operates at a rotation speed that increases with an increase in the ambient temperature, and thus cools the interior of the case 17 in such a manner that the first component temperature is not higher than the target temperature T1, as indicated by the one-dot chain line in (b) of FIG. 3. Since this cooling control operation simultaneously cools the second component 13, the second component temperature also decreases as depicted in (a) of FIG. 3 in a situation where the ambient temperature is high.

Meanwhile, when the ambient temperature is lower than T1x, the first component temperature does not reach the target temperature T1 even if the electronic apparatus 1 operates at a high output, and the cooling control section 23 does not exercise control to increase the rotation speed of the cooling fan 14 according to the first component temperature. Therefore, in a case where the cooling control section 23 does not exercise control based on the ambient temperature, the cooling fan 14 operates at the rotation speed based on the offset value. In this case, as depicted in (a) of FIG. 3, the second component temperature reaches the highest value when the ambient temperature is T1x. If the ambient temperature further decreases, the second component temperature also decreases accordingly. In a case where the second component temperature is higher than the target temperature T2 of the second component 13 when the ambient temperature is T1x, the second component 13 needs to be cooled by increasing the output of the cooling fan 14.

In the above instance, if the offset value preset for the rotation speed of the cooling fan 14 is sufficient for cooling the second component 13, the temperature of the second component 13 can be maintained equal to or lower than the target temperature T2 even in a case where the first component temperature is equal to or lower than the target temperature T1. However, when a high offset value is set, the cooling fan 14 continues operating at a relatively high output even in a case where, for example, the first component 11 has not generated significant heat and does not need to be cooled. This situation is unfavorable from the viewpoint of noise and power consumption suppression.

In view of the above circumstances, as indicated by the solid line in (b) of FIG. 3, the cooling control section 23 in the present embodiment exercises control to increase the output of the cooling fan 14 in a case where the ambient temperature is lower than the reference temperature Tr. The reference temperature Tr is set to a value that is greater than the ambient temperature T1$x$ at which the second component temperature reaches the highest value. The cooling control section 23 changes the rotation speed of the cooling fan 14 in such a manner that the output of the cooling fan 14 gradually increases when the ambient temperature decreases below the reference temperature Tr, and that the output of the cooling fan 14 reaches the highest value when the ambient temperature is T1$x$. In this instance, the rotation speed of the cooling fan 14 is set to a value that is able to decrease the second component temperature to a temperature equal to or lower than the target temperature T2. As a result, in a case where the second component temperature possibly increases above the target temperature T2, the cooling control section 23 is able to cool the second component 13 by increasing the output of the cooling fan 14.

The cooling control section 23 parallelly exercises cooling control based on the first component temperature and cooling control based on the ambient temperature, which are described above. That is, the duty ratio of the drive signal, which is to be eventually outputted to the cooling fan 14, is determined so as to provide the required performance of the cooling fan 14 that is determined based on the first component temperature, or the required performance of the cooling fan 14 that is determined based on the ambient temperature, whichever is higher. Therefore, in a situation where the electronic apparatus 1 is operating at a high output, cooling control is exercised based on the first component temperature when the ambient temperature is higher than a temperature indicated by the intersection of the solid line and the one-dot chain line in (b) of FIG. 3, and cooling control is exercised based on the ambient temperature when the ambient temperature is lower than the temperature indicated by the same intersection.

Further, as indicated by the solid line in (b) of FIG. 3, the cooling control section 23 may also exercise control to increase the output of the cooling fan 14 in a case where the ambient temperature is higher than a predetermined second reference temperature Tr2. In the example depicted in (b) of FIG. 3, the rotation speed determined based on the first component temperature, which is indicated by the one-dot chain line, is higher than the rotation speed indicated by the solid line. However, depending on the operating status of the electronic apparatus 1, the first component temperature may not increase, thereby resulting in a failure to exercise control based on the first component temperature. Even in such a situation, when the ambient temperature is high, the output of the cooling fan 14 can be increased to inhibit the second component temperature from being increased by an increase in the ambient temperature.

The following describes a specific example of control that is exercised by the cooling control section 23 according to the program execution information. In the following example, it is assumed that the cooling control section 23 changes a cooling control scheme according to a type of program currently executed by the electronic apparatus 1.

Specifically, according to the type of currently executed program, the cooling control section 23 selects a control mode of the cooling fan 14 from a plurality of prepared control modes. For example, the cooling control section 23 may select a control mode depending, for instance, on whether the currently executed program is a game application, a video reproduction application involving reading of media, or a video reproduction application involving no reading of media. Here, it is assumed that an optical disk drive (not depicted) is built in the electronic apparatus 1, and that the video reproduction application involving the reading of media is an application program for reproducing video based on video data read from an optical disk by the optical disk drive. Further, it is assumed that the video reproduction application involving no reading of media is an application program for reproducing video distributed through a communication network such as the Internet.

Further, the cooling control section 23 changes the control scheme for the cooling fan 14 according to the control mode selected based on the type of currently executed program. For example, according to the selected control mode, the cooling control section 23 may change parameters described thus far, such as the target temperature T1 for the first component 11 and the offset value for the rotation speed of the cooling fan 14.

Moreover, the cooling control section 23 may change parameters of response performance for temperature according to the selected control mode. Here, the response performance represents an output change rate (the amount of change per unit time) in a case where the output of the cooling fan 14 is changed when the target temperature T1 is exceeded by the first component temperature. The higher the response performance, the more rapidly the rotation speed of the cooling fan 14 changes. Consequently, the first component temperature can quickly be decreased to the target temperature T1.

FIG. 4 is a diagram illustrating examples of cooling control parameters for different control modes. In the examples of FIG. 4, values of cooling control parameters are predetermined for each of three types of control modes. Further, the cooling control parameters include the target temperature T1 for the first component temperature, the offset value for the rotation speed, and the value of response performance.

For example, the cooling control section 23 sets the target temperature T1, the offset value, and the response performance to high values for a period of execution of the game application. As a result, the cooling fan 14 operates at a certain rotation speed even in a state before the first component temperature reaches the target temperature T1, and control for increasing the output based on the target temperature T1 begins later than in the other control modes. Further, since the response performance is set to a high value, cooling can quickly be provided in a case where the target temperature T1 is exceeded.

Meanwhile, for a period of execution of the video reproduction application, the cooling control section 23 sets the offset value and the response performance to values lower than those for the period of execution of the game application. As a result, the rotation speed of the cooling fan 14 is relatively reduced, so that noise is unlikely to be generated by the operation of the cooling fan 14 while a user is watching video.

The foregoing description assumes that the cooling control parameters are for determining the cooling control scheme mainly based on the first component temperature. Alternatively, however, the cooling control scheme based on the ambient temperature may also be changed from one control mode to another in a similar manner.

Further, the foregoing description assumes that a control mode is to be selected according to the type of currently executed program. Alternatively, however, the operation information acquisition section 22 may acquire another type of information as the information regarding the operating status of the electronic apparatus 1 and allow the cooling control section 23 to select a control mode based on the information regarding such operating status. For example, the operation information acquisition section 22 may acquire information indicating whether or not a predetermined component is operating (information indicating whether or not, for example, the optical disk drive is operating) and allow the cooling control section 23 to change the control mode for the cooling fan 14 according to the acquired information.

As described above, the electronic apparatus 1 according to the present embodiment operates the cooling fan 14 in a case where the ambient temperature is decreased. This makes it possible to prevent an undue rise in the temperature of the second component 13, which is not directly monitored.

Further, the electronic apparatus 1 according to the present embodiment changes the control scheme for the cooling fan 14 according to the information regarding the operating status of the electronic apparatus 1. This makes it possible to provide cooling suitable for the situation.

It should be noted that the present invention is not limited to the foregoing embodiment. For example, the foregoing description assumes that the operation of the cooling fan 14 is controlled by the control circuit 16, which is separate from both the first component 11 and the second component 13. Alternatively, however, either the first component 11 or the second component 13 may control the operation of the cooling fan 14. In such an alternative case, either the first component 11 or the second component 13 implements the functions of the temperature acquisition section 21, the operation information acquisition section 22, and the cooling control section 23 although the foregoing description assumes that such functions are implemented by the control circuit 16.

Further, the foregoing description assumes that the cooling control section 23 exercises both control based on the ambient temperature acquired by the temperature acquisition section 21 and control based on the program execution information acquired by the operation information acquisition section 22. Alternatively, however, the cooling control section 23 may exercise control based only on either the ambient temperature or the program execution information.

Further, it is assumed that the electronic apparatus 1 according to the present embodiment provides cooling control based on two types of temperatures measured by the first component temperature sensor 12 and the ambient temperature sensor 15. Alternatively, however, the electronic apparatus 1 may include an additional temperature sensor and provide cooling control based on results of measurements made by the additional sensor. As a specific example, when the temperature measured by an additional sensor mounted on the printed circuit board 10 is higher than a predetermined target temperature, the cooling control section 23 may exercise control to increase the output of the cooling fan 14.

Moreover, the cooling device described in conjunction with the present invention is not limited to the cooling fan 14. The cooling device may be a device that cools the first component 11 and the second component 13 by a different method. In such a case, too, it is assumed that the cooling control section 23 is able to change the cooling performance of the cooling device in real time and is configured to exercise control so as to increase or decrease the output of the cooling device according to the results of measurements made by the individual temperature sensors.

Additionally, the foregoing description assumes that the first component 11 is a microprocessor for executing various application programs, and that the operation information acquisition section 22 acquires the program execution information from the first component 11. However, the application programs may alternatively be executed, for example, by a different processor other than the first component 11.

REFERENCE SIGNS LIST

1: Electronic apparatus
10: Printed circuit board
11: First component
12: First component temperature sensor
13: Second component
14: Cooling fan
15: Ambient temperature sensor
16: Control circuit
17: Case
21: Temperature acquisition section
22: Operation information acquisition section
23: Cooling control section

The invention claimed is:

1. An electronic apparatus having a first component and a second component, both of which generate heat during an operation, the electronic apparatus comprising a circuitry configured to:
   acquire an ambient temperature of the electronic apparatus;
   acquire a temperature of the first component; and
   operate a cooling device to cool the first component and the second component that generate heat during the operation,
   wherein,
   (i) when the ambient temperature is lower than a predetermined reference temperature, the circuitry is further configured to increase an output of the cooling device to a value higher than that obtained when the ambient temperature is equal to or higher than the predetermined reference temperature,
   (ii) when the ambient temperature is equal to or higher than the predetermined reference temperature and the temperature of the first component does not exceed a target temperature, operate the cooling device at a reference output value, wherein the second component requires a lower output from the cooling device to be cooled than the output required to cool the first component, and
   (iii) when the temperature of the first component exceeds the target temperature, increase the output of the cooling device above the reference output value.

2. The electronic apparatus according to claim 1, wherein the predetermined reference temperature is higher than an ambient temperature where the temperature of the first component increases to the target temperature under predetermined operating conditions.

3. The electronic apparatus according to claim 1, wherein a cooling fan is adopted as the cooling device, and the circuitry is further configured to acquire, as the ambient temperature, a temperature of air taken in by the cooling fan.

4. An electronic apparatus having a first component and a second component, both of which generate heat during an operation, the electronic apparatus comprising a circuitry configured to:
   acquire information regarding an operating status of the electronic apparatus;

acquire a temperature of the first component; and operate a cooling device to cool the first component and the second component that generate heat during the operation, wherein, based on the information regarding the operating status and the temperature of the first component, the circuitry is further configured to change a control scheme for operating the cooling device, wherein, (i) when the temperature of the first component exceeds a target threshold under a given operating status, the circuitry is further configured to increase an output of the cooling device, (ii) when the operating status indicates a performance mode, the circuitry is further configured to increase an output of the cooling device or lowers the target threshold, and (iii) when the operating status indicates a mode with reduced cooling requirements, the circuitry is further configured to reduce the output of the cooling device or raise the target threshold, wherein the raised target threshold does not trigger overheating of the second component.

5. The electronic apparatus according to claim 4, wherein the information regarding the operating status includes information indicating a type of a program currently executed by the electronic apparatus, and the circuitry is further configured to change a control scheme for the cooling device according to the type of the currently executed program.

6. The electronic apparatus according to claim 4, wherein, based on the information regarding the operating status, the circuitry is further configured to change at least one of parameters indicating a minimum output value of the cooling device, the target threshold for the first component that generates heat during the operation, and response performance for a temperature of the first component.

7. A control method for an electronic apparatus having a first component and a second component, both of which generate heat during an operation, the control method comprising:

acquiring an ambient temperature of the electronic apparatus;

acquiring a temperature of the first component; and operating a cooling device to cool the first component and the second component that generate heat during the operation, wherein, (i) when the ambient temperature is lower than a predetermined reference temperature, the operating exercises control to increase an output of the cooling device to a value higher than that obtained when the ambient temperature is equal to or higher than the predetermined reference temperature, (ii) when the ambient temperature is equal to or higher than the predetermined reference temperature and the temperature of the first component does not exceed a target temperature, the operating exercises control to operate the cooling device at a reference output value, wherein the second component requires a lower output from the cooling device to be cooled than the output required to cool the first component, and (iii) when the temperature of the first component e t temperature, the operating exercises control to increase the output of the cooling device above the reference output value.

\* \* \* \* \*